(12) United States Patent
Maier et al.

(10) Patent No.: US 9,130,512 B2
(45) Date of Patent: *Sep. 8, 2015

(54) AUDIO AMPLIFIER AND METHOD FOR RECOGNITION AN AUDIO AMPLIFIER

(75) Inventors: Martin Maier, Irlbach (DE); Josef Taffner, Donaustauf (DE); Josef Plager, Bogen (DE)

(73) Assignee: Robert Bosch GmbH, Stuttgart (DE)

(*) Notice: Subject to any disclaimer, the term of this patent is extended or adjusted under 35 U.S.C. 154(b) by 382 days.

This patent is subject to a terminal disclaimer.

(21) Appl. No.: 13/001,797

(22) PCT Filed: Jun. 10, 2009

(86) PCT No.: PCT/EP2009/057204

§ 371 (c)(1),
(2), (4) Date: Feb. 14, 2011

(87) PCT Pub. No.: WO2010/003756

PCT Pub. Date: Jan. 14, 2010

(65) Prior Publication Data

US 2011/0128075 A1   Jun. 2, 2011

(30) Foreign Application Priority Data

Jul. 9, 2008  (DE) .......................... 10 2008 040 291

(51) Int. Cl.
*H03F 99/00*  (2009.01)
*H03F 3/217*  (2006.01)
*H03G 3/30*  (2006.01)

(52) U.S. Cl.
CPC .............. *H03F 3/217* (2013.01); *H03G 3/3026* (2013.01)

(58) Field of Classification Search
USPC ......... 381/120, 121; 330/84, 124 R, 126, 144
See application file for complete search history.

(56) References Cited

U.S. PATENT DOCUMENTS 4,721,923 A * 1/1988 Bares et al. .................... 330/284
5,200,709 A * 4/1993 Saito et al. ..................... 330/126

(Continued)

FOREIGN PATENT DOCUMENTS

EP    0 590 903    4/1994
EP    0 762 633    3/1997

(Continued)

OTHER PUBLICATIONS

Bohn, Dennis. "Constant-Voltage Audio Distribution Systems." Rane Corporation, Mar. 2007. Web. <http://www.rane.com/note136.html>.*

*Primary Examiner* — Joseph Saunders, Jr.
*Assistant Examiner* — James Mooney
(74) *Attorney, Agent, or Firm* — Michael J. Striker

(57) ABSTRACT

Audio amplifiers are used in many known forms in music systems, for example for domestic use or for playing music in cinemas, discos etc., but also in public address systems, as are known, for example, in public buildings, schools, universities etc. for making announcements. The invention proposes an audio amplifier (1) for amplifying an input signal into an output signal using an output amplifier stage (6), wherein the output amplifier stage (6) is designed to amplify an intermediate signal into the output signal, and wherein the output amplifier stage (6) is in the form of an amplifier which operates in switching mode, and having a limiter device (4) which is designed, from a program and/or circuit point of view, to generate the intermediate signal on the basis of the input signal, wherein the level of the intermediate signal is always limited as a function of an adjustable maximum level in such a way that the output signal does not exceed the maximum level independently of the input signal.

10 Claims, 2 Drawing Sheets

(56) References Cited

U.S. PATENT DOCUMENTS

| | | | |
|---|---|---|---|
| 5,389,829 A | 2/1995 | Milazzo | |
| 5,506,532 A | 4/1996 | Milazzo | |
| 5,532,649 A * | 7/1996 | Sahyoun | 330/297 |
| 5,789,975 A * | 8/1998 | Yoshida et al. | 330/10 |
| 6,765,436 B1 | 7/2004 | Melanson et al. | |
| 6,853,242 B2 | 2/2005 | Melanson et al. | |
| 6,980,058 B2 | 12/2005 | Noro | |
| 2011/0158437 A1 * | 6/2011 | Taffner et al. | 381/120 |

FOREIGN PATENT DOCUMENTS

| | | |
|---|---|---|
| JP | 2-186812 | 7/1990 |
| JP | 3-192907 | 8/1991 |
| JP | 9-130160 | 5/1997 |
| JP | 2002-198756 | 7/2002 |
| JP | 2004-214793 | 7/2004 |
| JP | 2005-94144 | 4/2005 |
| JP | 2005-223717 | 8/2005 |
| JP | 2006-60545 | 3/2006 |
| WO | 2004/023631 | 3/2004 |

* cited by examiner

AUDIO AMPLIFIER AND METHOD FOR RECOGNITION AN AUDIO AMPLIFIER

CROSS-REFERENCE

The invention described and claimed hereinbelow is also described in PCT/EP2009/057204, filed Jun. 10, 2009 and DE 10 2008 040 291.5, filed Jul. 9, 2008. This German Patent Application, whose subject matter is incorporated here by reference, provides the basis for a claim of priority of invention under 35 U.S.C. 119 (a)-(d).

The invention relates to an audio amplifier for amplifying an input signal into an output signal, comprising an output amplification stage, wherein the output amplification stage is designed as an amplifier that operates in the switched mode to amplify an intermediate signal into the output signal. The invention furthermore relates to a method for reconfiguring an audio amplifier.

BACKGROUND INFORMATION

Audio amplifiers are used in many known designs in music systems, e.g. for home use or to provide music in movie theaters, discotheques, etc., or in public address systems which are used e.g. in public buildings, schools, universities, etc. to disseminate announcements. Audio amplifiers of that type can be based on any type of amplifier principle and are all based on the principle of converting an input signal into an amplified output signal.

Standards now govern the output interfaces of audio amplifiers, however, wherein two different technologies for implementing the standards are currently in use. The two technologies differ in terms of how the electromechanical acoustic signal transformers are supplied with the output signal.

On the one hand, low-impedance operation of audio amplifiers is known, wherein the audio amplifier is a low ohmic, controlled voltage source and directly drives the connected loudspeakers and electromechanical acoustic signal transformers. When used in public address systems in large buildings or spaces, however, this technology often requires that the cross section of the loudspeaker lead be disproportionately large, due to the currents that are required and the length of the loudspeaker leads.

In applications of this type in particular, a different technology is utilized, e.g. high-impedance operation, which is also known as 100-volt technology. According to this technology, the output signal of the audio amplifier is transformed to 100 volts using a low-frequency transmitter and, as in the case with energy distribution networks at this voltage level, are transmitted to a plurality of loudspeakers connected in parallel. Each loudspeaker has a separate transmitter or transformer for adjusting the voltage and impedance. The advantage of the technology is that loudspeaker leads having a small cross section can be used for power supply, the public address system can be expanded very easily by connecting additional loudspeakers in parallel, and the loudness level of individual loudspeakers can be adjusted by tapping into the transmitter or transformer in the loudspeaker. High-impedance systems are not limited to a voltage level of 100 volts; a voltage level of 70 volts is also common, for instance.

SUMMARY OF THE INVENTION

The audio amplifier according to the invention is suited and/or designed to amplify an input signal into an output signal. The audio amplifier can be used e.g. in music systems or, preferably, in public address systems, in particular in public address systems for use in complex regions. The output signal of the audio amplifier is preferably defined as the signal that is output to electromechanical acoustic signal transformers and/or loudspeakers. The input signal is preferably designed as an analog signal that originates at a microphone or another audio source.

The audio amplifier includes further, optional components and at least one output amplification stage which is suited and/or designed to amplify an intermediate signal into the output signal. The intermediate signal is designed, in particular, as a signal that is generated on the basis of the input signal.

The output amplification stage is designed as an amplifier that is operated in the switched mode, in particular as an amplifier that amplifies a pulse-width modulated signal that is generated on the basis of the input signal and/or the intermediate signal, or that represents the intermediate signal.

Within the scope of the invention it is provided that a limiter device is integrated in the audio amplifier, which is programmed and/or electronically configured to generate the intermediate signal on the basis of the input signal, wherein the level of the intermediate signal is always limited as a function of an adjustable maximum level in a manner such that the output signal does not exceed the maximum level independently of the input signal.

The invention is based on the idea of providing an audio amplifier that can be used in a flexible manner for low-impedance operation and for high-impedance operation. Due to the adjustable maximum level, the audio amplifier is preferably not limited to certain discrete power outputs, but rather can be scaled within a wide range in terms of power output or maximum output level. A further advantage is that, in high-impedance operation, a transmitter or transformer is not required at the output of the audio amplifier.

A further useful advantage of the invention can result from the fact that combinations of low-impedance and high-impedance applications are used in many tasks involving acoustic irradiation. It can be practical, for example, to use low-impedance technology to acoustically irradiate a main room containing a stage, but to implement high-impedance technology in secondary rooms, hallways, etc. Until now it was necessary to provide various audio amplifiers or switchable audio amplifiers which usually had to provide different internal supply voltages, depending on the operating mode. In certain cases it was also necessary to connect transformers or transmitters to the outlet of the audio amplifier. In contrast, in the case of the novel audio amplifier, the maximum output voltage or level voltage is realized not exclusively by the internal supply voltage, but rather by the limiter device which limits the audio signal in a small-signal range i.e. upstream of the output amplification stage.

According to a preferred embodiment, the output amplification stage is supplied with only a single bipolar voltage supply and/or is designed as a class-D amplifier and/or with constant amplification. This preferred embodiment underscores the advantage of the invention, namely that of providing an audio amplifier that includes cost-effective circuitry. The supply voltage of the bipolar voltage supply is preferably selected such that the output amplification stage can deliver the highest output voltage necessary at the minimally specified impedance of the loudspeaker that is connected. Designing the output amplification stage as a class-D amplifier and/or with constant amplification is based on the fact that amplifiers of that type deliver consistently high efficiency across wide ranges of the input level of the intermediate signal.

According to one possible practical implementation of the invention, the audio amplifier can be switched between a low-impedance operating mode and a high-impedance operating mode by adjusting the maximum level. In low-impedance operation, the loudspeakers or electromechanical acoustic signal transformers are controlled directly by the audio amplifier; one possible typical impedance is 4 ohms. In high-impedance operation, the signal voltages or signal levels are up to 70 volts (70-volt technology) or up to 100 volts (100-volt technology). The electromechanical acoustic signal transformers preferably include transformers and/or transmitters that transform the output signal. This practical implementation once more underscores the idea of the invention of providing an audio amplifier that can be used in a flexible manner according to various standards, in particular in high-impedance and low-impedance operation, wherein, due to the selected design of the amplifier, there is no need to provide a plurality of internal supply voltages or a transmitter at the output of the audio amplifier.

According to a development of the invention, the limiter device comprises an analyzer unit and a limiter unit, wherein the analyzer unit outputs and/or feeds back a limiter signal to the limiter unit on the basis of an audio carrier signal that is present. The audio carrier signal can be designed as the input signal, or as a signal that has already been processed further. The analyzer unit and the limiter unit form a control loop, the control being designed such that the output signal does not exceed the maximum level that was set, or the intermediate signal does not exceed a maximum level corresponding thereto in the small-signal range.

The limiter unit can be designed as a preamplification device, the amplification of which is adjusted as a function of the limiter signal that is fed back, and/or as a damping device that dampens the audio carrier signal that is present on the limiter signal that is fed back. Optionally, the analyzer unit can likewise be designed as a limiter module, thereby enabling the limiter device to perform limitation in two stages; in the first stage—in the limiter unit—amplification is controlled or regulated and, in the second stage—in the analyzer unit—damping is controlled or regulated.

According to one possible embodiment, the limiter device is connected upstream of the output amplification stage and analyzes or limits the analog audio carrier signal, thereby forming the intermediate signal. According to an alternative embodiment of the invention, the limiter device is integrated in terms of circuit design such that the audio carrier signal is pulse-width modulated, and then the pulse-width modulated audio carrier signal is limited, thereby forming the intermediate signal.

According to a development of the invention, the audio amplifier includes a connectable high pass which is designed e.g. as a second-order Butterworth filter to filter the audio carrier signal. Preferably, the audio amplifier is designed such that the connectable high pass is activated exclusively in the high-impedance operating mode. As is the case for all high-impedance amplifiers, this is recommended to prevent saturating the transmitters in the loudspeakers with low-frequency signals.

According to another development of the invention, the audio amplifier includes an input amplification device that is designed to condition the input signal, in particular to adjust the input impedance and the input level.

Optionally, the audio amplifier also includes a level-adjusting device for adjusting the volume and/or the amplification. The level-adjusting device is preferably connected such that it acts on the audio carrier signal in the small-signal range.

According to a preferred embodiment of the invention, the audio amplifier includes a control device which is designed as an interface, in particular a manual or electrical/electronic interface e.g. for a user, and which enables the maximum level to be selected. The control device preferably acts on the connectable high pass (if available) or on the limiter device.

Although the present invention was described only on the basis of an output amplification stage and a limiter device, it lies within the scope of the invention for the audio amplifier to comprise a plurality of channels, each of which includes an output amplification stage that are assigned to one or more limiter devices. Using a multichannel audio amplifier of that type, it is possible to run a mixed operation of low-impedance and high-impedance operating modes and, in this manner, e.g. in terms of the aforementioned example, on the basis of an audio amplifier to operate a low-impedance loudspeaker at an impedance of e.g. 4 ohms, and a high-impedance loudspeaker in the direct drive mode or using 100-volt or 70-volt technology. To reconfigure a music system of that type, it is only necessary to switch the operating mode or modes on the control device.

A further subject matter of the invention relates to a method for reconfiguring an audio amplifier according to one of the preceding claims between a low-impedance operating mode and a high-impedance operating mode, wherein, in a first step, the low-impedance or the high-impedance loudspeaker system is disconnected from the audio amplifier, in a subsequent step the maximum level is switched to the high-impedance or low-impedance operating mode and, in a final step, the high-impedance or low-impedance loudspeaker system is connected. Thus, a music system comprising the audio amplifier is also disclosed within the scope of the invention, wherein a low-impedance loudspeaker system and/or a high-impedance loudspeaker system can be operated in succession, in alternation, or simultaneously, if a plurality of channels is present.

BRIEF DESCRIPTION OF THE DRAWINGS

Further features, advantages, and effects of the invention result from the description that follows of a preferred embodiment of the invention, and from the attached figures. They show.

DETAILED DESCRIPTION OF THE PREFERRED EMBODIMENTS

Figure 1:
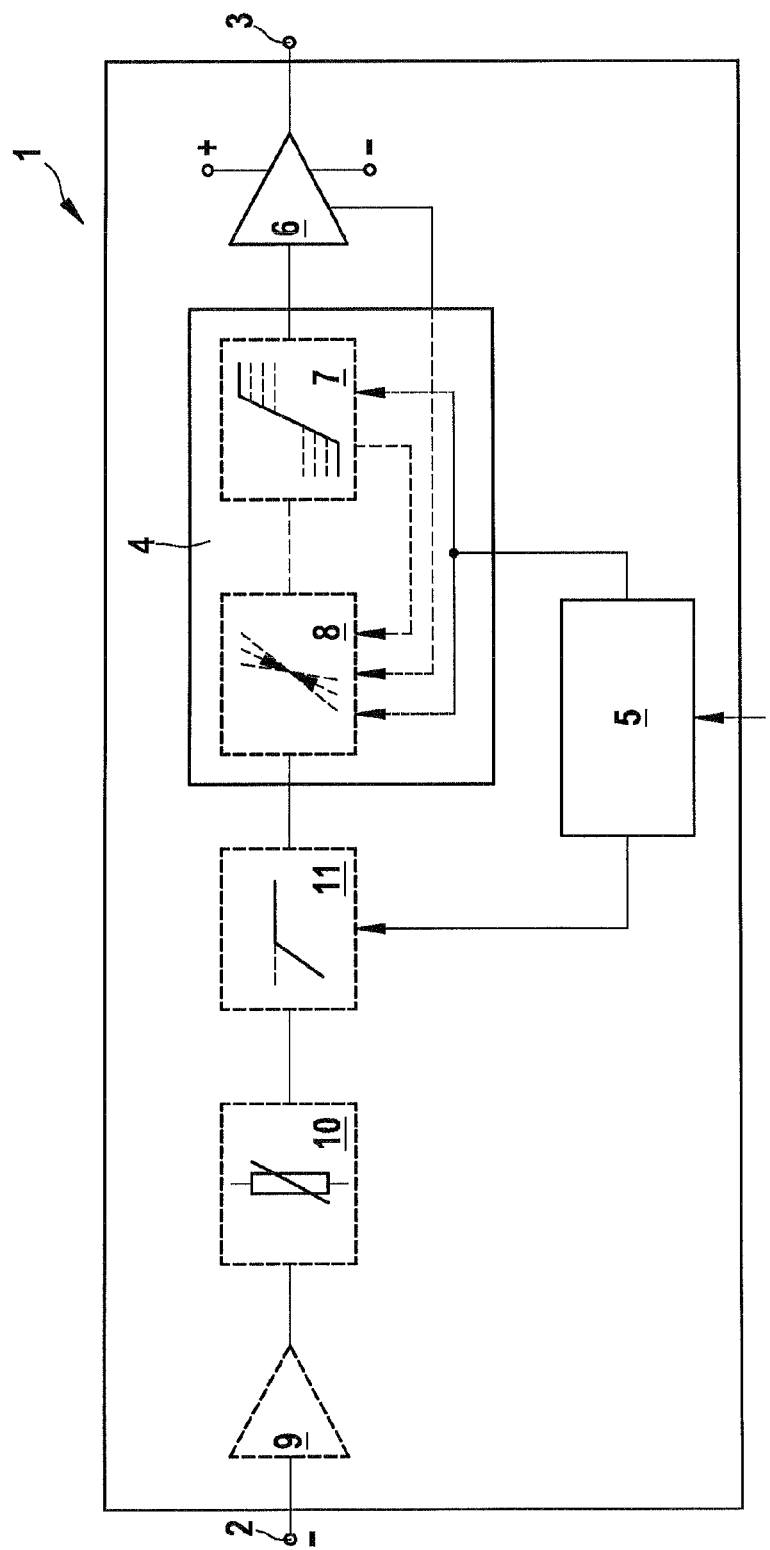
FIG. 1 a block diagram of an audio amplifier according to the invention.

FIG. 1 shows, in a schematic block diagram, an audio amplifier 1 which is designed to amplify an input signal present at an input interface 2 into an output signal present at an output interface 3. Audio amplifier 1 is designed such that, at output interface 3, an output signal for a loudspeaker system (not depicted) can be output using an output signal, the signal level or signal voltage of which is effectively up to 70 volts and/or up to 100 volts, in a low-impedance operating mode, e.g. designed for an impedance of 4 ohms, or in a high-impedance operating mode.

In the block diagram, the most important components are depicted using a solid line, and the optional components of audio amplifier 1 are depicted using dashed lines. Starting at input interface 2, the input signal is routed, optionally using further functional modules—also referred to as an audio carrier signal in the original state or in the processed state—to a limiter device 4 which limits the audio carrier signal as a function of a control signal of a control unit 5, and is forwarded as a limited intermediate signal to an output amplification stage 6.

Output amplification stage 6 is designed as a class-D amplifier. The class-D amplifier operates in a switched mode, wherein the theoretical power efficiency is 100%, and the practical efficiency is 90% due to losses from switching and conduction. In an embodiment presented as an example, a class-D amplifier can be subdivided into three regions, the first region comprising an input for the intermediate signal, a triangular signal generator and a comparator, the second region comprising a switch amplification stage, and the third region comprising a low-pass filter.

In the first region, the preferably triangular-wave signal, which is generated by the signal generator, is modulated by the intermediate signal, wherein the comparator compares the voltage values of the intermediate signal with that of the signal from the signal generator and then switches its output on or off depending on which of the two signals has the higher voltage at that moment. The first region is therefore a pulse-width modulation (PWM) which provides, as the output signal, a square-wave signal having the same frequency as the signal of the signal generator, but having rectangles—the pulse widths—of different widths. The latter depict the information via the amplitude and frequency of the audio signal. In the second region, the PWM signal is amplified e.g. using transistors, the transistors being fully enabled or fully disabled, and therefore being on or off, which is also the reason for the high efficiency of this circuit design. In the third region, the carrier signal generated by the signal generator is filtered out, for which a passive LC filter is typically used. Due to the internal design and the independence of the efficiency of the modulation, the class-D amplifier can also be operated in a starting voltage range that represents only a fraction of the actual operating voltage that is available. It should be noted that the present invention is not limited to a certain topology of a class-D amplifier and, in particular, is not bound to a certain modulation or feedback scheme of the class-D amplifier.

Due to limiter device 4 which can be adjusted using control unit 5, the audio carrier signal is limited symmetrically, and therefore a limited intermediate signal is present at downstream output amplification stage 6. The level of the particular limitation is specified in a suitable manner by control unit 5 depending on the operating mode that was selected. Since the downstream class-D amplifier has constant amplification and always operates in the linear range due to the selected level of the supply voltage, entire audio amplifier 1 behaves, as viewed from the outside, like a conventional amplifier, where the internal voltage supply can be adjusted virtually steplessly. The limiting is designed such that the maximum output voltage at output interface 3 is not determined by the internal voltage supply, but by limiter device 4 in the small-signal range. The voltage supply for output amplification stage 6 is selected such that it can deliver the highest output voltage necessary at the minimally specified impedance.

The operating voltage is not switched over or reduced in low-impedance operation, either; output amplification stage 6, which is designed as an end-stage block, continues to be supplied with the high operating voltage. Instead, the limitation of the output voltage at output interface 3 is achieved using adjustable limiter device 4 in the small-signal range. The "clip limit" is selected such that the maximum output voltage that can thus be achieved at output interface 3 is appropriate for the selected operating mode.

In one possible embodiment, limiter device 4 can be composed of an analyzer unit 7 and a limiter unit 8, as depicted in FIG. 1. In terms of function, analyzer unit 7 analyzes the audio carrier signal that is present and outputs a limiting signal to limiter unit 8, thereby enabling it to amplify or dampen the audio carrier signal. Optionally, analyzer unit 7 also dampens the audio carrier signal.

Figure 2:
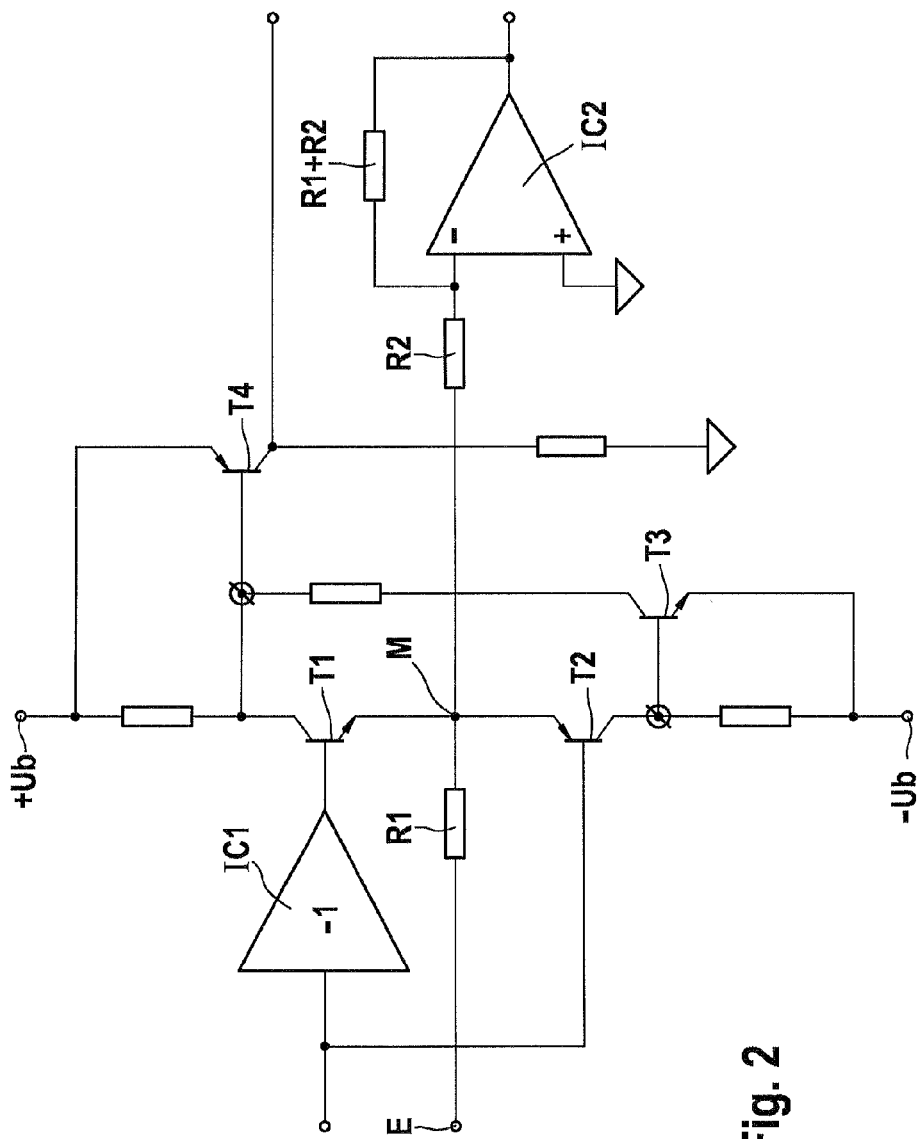
FIG. 2 a block diagram of the analyzer unit in the audio amplifier depicted in FIG. 1.

One possible embodiment of analyzer unit 7 is depicted in FIG. 2 in a schematic wiring diagram. The audio carrier signal is supplied to analyzer unit 7 at an input E via a resistor R 1. Resistor R 1, in combination with a resistor R 2, forms a voltage divider. Common center point M of this voltage divider is simultaneously connected, as a node, to the emitters of transistors T1 and T2, wherein transistors T1 and T2 limit the signal. When they are in the cut-off state, the current of the audio carrier signal flows through resistor R 1 to a negative input of an operational amplifier IC 2 which is connected to virtual ground. Since operational amplifier IC2 is fed back to R1 plus R2, the amplification of the limiter is zero dB. The application of limiter device 4 is specified by a positive control voltage from control unit 5, which is present at input S. To achieve symmetrical signal limitation, control signal S is inverted using an operational amplifier IC1. The inverted control signal is supplied to the base of T1, and the non-inverted control signal is supplied to the base of T2. If the audio carrier signal exceeds the control voltage by the base-middle forward voltage at the center point of voltage divider R1 and R2, then T2 becomes conductive. As a result, T2 clips the input level in the positive voltage range at the level of the control voltage plus one diode region. In the same manner, T1 clips the input signal in the negative voltage range. In this manner, the selection of the control voltage results in a symmetrical signal limitation of the control signal of downstream output amplification stage 6. Transistors T3 and T4 are required only when limiter unit 8 is present. Transistors T3 and T4 provide a trigger signal when signal limitation is used in analyzer unit 7 of limiter unit 8. This trigger signal is 0 volts in the rest state; when signal limitation is used, it increases to positive UB since T4 becomes conductive. Due to this control loop, hard clipping of the audio signal in limiter device 4 does not occur; instead, upstream limiter unit 8 reduces the amplification accordingly until the application limit of the limitation has just been reached by analyzer unit 7.

As an option, audio amplifier 1 includes the following components as further functional blocks: An input amplification device 9 adapts the input signal in terms of impedance and level to the downstream stages of audio amplifier 1. For an amplifier according to the present invention, it is inconsequential whether the input amplifier was designed for symmetrical or asymmetrical input signals. A level adjuster 10 is used to adjust the volume and amplification. Level adjustor 10 is not absolutely necessary for the function of audio amplifier 1, and optionally can be omitted. A switchable high pass 11 is activated by control unit 5 exclusively in the direct drive operating mode and/or during high-impedance operation. As is the case for all high-impedance amplifiers, this is recommended to prevent saturating the transmitters in the loudspeakers in the connected line with low-frequency signals. A typical implementation of high pass 11 is a second-order Butterworth filter having a cut-off frequency of 50 Hz. It is also feasible to design the cut-off frequency of high pass 11 to be tunable in a stepped or stepless manner. In low-impedance operation, high pass 11 is deactivated by control unit 5. As an optional additional function, limiter unit 8 ensures that the distortions of the output signal do not exceed a certain percentage (e.g. 1%) under any circumstances. If audio amplifier 1 had to leave its linear region, e.g. if the limit of the operating voltage was reached or if limited by analyzer unit 7, then limiter device 8 reduces the amplification until the distortions of the output signal remain limited. According to an alternative operating mode, it can also make sense for control unit 5 to adjust the amplification of entire audio amplifier 1 in limiter unit 8. Thus, the amplification can be freely selected in the different operating modes e.g. a constant input sensitivity can be achieved in low-impedance operation and in high-impedance operation.

What is claimed is:

1. An audio amplifier (1) for amplifying an input signal into an output signal, comprising:
    an output amplification stage (6), wherein the output amplification stage (6) is designed to amplify an intermediate signal into the output signal, wherein the output amplification stage (6) operates in switched mode;
    a limiter device (4) which is programmed and/or electronically configured to generate the intermediate signal on the basis of the input signal, wherein a level of the intermediate signal is always limited as a function of an adjustable maximum level in a manner such that the output signal does not exceed the maximum level independently of the input signal; and
    a control unit (5) which is designed to set the maximum level and which drives a switchable high pass (11) or the limiter device (4) or both;
    wherein the audio amplifier (1) is switchable between a low-impedance operating mode and a high-impedance operating mode by adjusting the maximum level,
    wherein in the high-impedance operating mode, a level of the output signal is up to 70 volts or up to 100 volts for operation with 70-volt technology and 100-volt technology, respectively, and
    wherein to reconfigure the operating modes, only the operating mode on the control device must be adjusted.

2. The audio amplifier (1) according to claim 1, wherein the output amplification stage (6) is supplied by a single bipolar voltage supply and/or the output amplification stage is designed as a class-D amplifier and/or with constant amplification.

3. The audio amplifier (1) according to claim 1, wherein the limiter device (4) comprises an analyzer unit (7) and a limiter unit (8), wherein the analyzer unit (7) outputs and/or feeds back a limiting signal to the limiter unit (8) on the basis of an audio carrier signal that is present.

4. The audio amplifier (1) according to claim 3, wherein the limiter unit (8) is designed as a preamplification device and/or a damping device.

5. The audio amplifier (1) according to claim 1, wherein the switchable high pass (11) is activated exclusively during high-impedance operation.

6. The audio amplifier (1) according to claim 1 further comprising an input amplifier device (9) for conditioning the input signal.

7. The audio amplifier (1) according to claim 1, further comprising a level adjusting device (10) for adjusting the loudness level and/or the amplification of the audio amplifier (1).

8. The audio amplifier (1) according to claim 1, further comprising a plurality of channels, wherein each channel includes an output amplification stage (6) and an assigned limiter device (4).

9. A method for reconfiguring an audio amplifier (1), according to claim 1, between a low-impedance operating mode and a high-impedance operating mode, comprising the steps:
    disconnecting a low-impedance or high-impedance loudspeaker system from the audio amplifier (1);
    switching the maximum level to the high-impedance or low-impedance operating mode;
    if switched to the high-impedance operating mode, setting the level of the output signal to either up to 70 volts or up to 100 volts; and
    connecting the high-impedance or low-impedance loudspeaker system.

10. An audio amplifier (1) for amplifying an input signal into an output signal, comprising:
    an output amplification stage (6), wherein the output amplification stage (6) is designed to amplify an intermediate signal into the output signal, wherein the output amplification stage (6) operates in switched mode;
    a limiter device (4) which is programmed and/or electronically configured to generate the intermediate signal on the basis of the input signal, wherein level of the intermediate signal is always limited as a function of an adjustable maximum level in a manner such that the output signal does not exceed the maximum level independently of the input signal; and
    a control unit (5) which is designed to set the maximum level and which drives a switchable high pass (11) or the limiter device (4) or both;
    wherein the audio amplifier (1) is switchable between a low-impedance operating mode and a high-impedance operating mode by adjusting the maximum level,
    wherein in the high-impedance operating mode, a level of the output signal is up to 70 volts or up to 100 volts for operation with 70-volt technology and 100-volt technology, respectively,
    wherein to reconfigure the operating modes, only the operating mode on the control device must be adjusted, and
    wherein the switchable high pass is activated exclusively during high-impedance operation.

* * * * *